United States Patent [19]

Shinozaki

[11] Patent Number: 5,623,453
[45] Date of Patent: Apr. 22, 1997

[54] SYNCHRONOUS SEMICONDUCTOR DEVICE WITH DISCONTINUED FUNCTIONS AT POWER DOWN

[75] Inventor: Naoharu Shinozaki, Kawasaki, Japan

[73] Assignee: Fujitsu Limited, Kanagawa, Japan

[21] Appl. No.: 582,389

[22] Filed: Jan. 3, 1996

[30] Foreign Application Priority Data

Aug. 31, 1995 [JP] Japan ..................... 7-223785

[51] Int. Cl.$^6$ ..................................... G11C 8/00
[52] U.S. Cl. ..................... 365/233; 365/193; 365/227; 365/233.5
[58] Field of Search ..................... 365/193, 227, 365/228, 233.5, 233

[56] References Cited

U.S. PATENT DOCUMENTS

| | | | |
|---|---|---|---|
| 4,906,862 | 3/1990 | Itano et al. | 365/227 |
| 5,113,373 | 5/1992 | Lee | 365/227 |
| 5,473,572 | 12/1995 | Margeson, III | 365/236 |

*Primary Examiner*—David C. Nelms
*Assistant Examiner*—F. Niranjan
*Attorney, Agent, or Firm*—Nikaido Marmelstein Murray & Oram LLP

[57] ABSTRACT

A synchronous semiconductor device operates in synchronism with clock signal supplied from an external unit. The synchronous semiconductor device can be set in a first mode (a CSUS mode) and a power down mode (a PD mode) as an operation mode when a predetermined external signal (a CKE signal) is in a predetermined state. The synchronous semiconductor device includes a first signal generating circuit for generating a rasz signal which may be in a first state and in a second state which permits the synchronous semiconductor device to be in a state where data is not output, a second signal generating circuit for generating a rasdz signal, a change of the rasdz signal from a first state to a second state being delayed for a delay time from a change of the rasz signal generated by the first signal generating circuit from the first state to the second state, and a power down control circuit for activating the power down mode in synchronism with the clock signal when the rasdz signal is in the second state under a condition in which the predetermined external signal is in the predetermined state, so that the synchronous semiconductor device is in the power down mode.

5 Claims, 16 Drawing Sheets

6,623,453

SYNCHRONOUS SEMICONDUCTOR DEVICE WITH DISCONTINUED FUNCTIONS AT POWER DOWN

BACKGROUND OF THE INVENTION

(1) Field of the Invention

The present invention generally relates to a synchronous semiconductor device, such as a synchronous dynamic random access memory (SDRAM), and more particularly to a synchronous semiconductor device in which operations may be performed in a power down mode (a PD mode) and in a clock suspending mode (a CSUS mode). In the PD mode, DC current which should be supplied to input circuits is cut off to reduce power dissipation. In the CSUS mode, an internal clock signal which is used as a synchronous signal is suspended so that chip-access from an external unit is suspended.

(2) Description of the Related Art

A SDRAM (Synchronous Dynamic Random Access Memory) which operates in synchronism with a clock signal supplied from an external unit is generally formed as shown in FIG. 1.

Referring to FIG. 1, an SDRAM has a timing control circuit 100, a memory control circuit 200 and a memory bank 300. The timing control circuit 100 is provided with pads $P_1$, $P_2$, $P_3$, $P_4$, $P_5$, ... to which a RAS (Row Address Strobe) signal, a CAS (Column Address Strobe) signal, a WE (Write Enable) signal, a CKE (Clock Enable) signal, a CLK (an external Clock) signal and other external signals are input. In the memory bank 300, memory cells (cell transistors) are arranged. The timing control circuit 100 controls, based on the CLK signal input to the pad $P_5$, timing at which the external signals are input to the other pads. The external signals which are controlled by the timing control circuit 100 are supplied to the memory control circuit 200. The memory control circuit 200 supplies to the memory bank 300 operation signals (commands), such as a read-operation signal, a write-operation signal, a refresh-operation signal and a precharge-operation signal each of which are represented by combination of the external signals supplied from the timing control circuit 100. In accordance with the operation signals, operations, such as a read-write operation, are executed in the memory bank 300.

In the SDRAM, the operations may be executed in a power down mode (a PD mode) and in a clock suspending mode (a CSUS mode). In the PD mode, the DC currents which are to be supplied to input circuits for performing input operations of external signals are cut off when there is no chip-access, so that the power dissipation can be reduced. In the CSUS mode, the internal clock signal synchronized with the external clock signal is suspended to prohibit the chip-access.

The SDRAM in which the memory bank 300 is inactive is set in the PD mode when it is detected, in synchronism with the external clock signal, that the CKE (Clock Enable) signal has a low level as shown in FIG. 2. The PD mode is not maintained for a time equal to or longer than the refresh time $t_{REF}$. The SDRAM in which the memory bank 300 is active is set in the CSUS mode when it is detected, in synchronism with the external clock signal, that the CKE signal has a low level as shown in FIG. 3. When the SDRAM is set in the CSUS mode, the internal clock signal, synchronized with the external clock signal, is suspended. In an example shown in FIG. 3, the internal clock signal is suspended after one clock from when it is detected that the CKE is at the low level. That is, an CKE latency is one clock. As the result of suspending of the internal clock signal, in the case of a read-operation, read data is not varied while the internal clock signal is suspended (see data Q2 and Q3 in FIG. 3). In the case of a write-operation performed in synchronism with the internal clock signal, data is not written while the internal clock signal is suspended.

In both the cases of entry of the PD mode and the CSUS mode, the CKE signal has to fall to the low level. In a state where the CKE signal has the low level, in accordance with the internal state (the memory bank 300 is in the active state or in the inactive state) of the SDRAM, either the PD mode or the CSUS mode is selected.

The timing control circuit 100 in the conventional SDRAM generates an internal RAS signal (hereinafter referred to as a rasz signal). The rasz signal rises when the memory bank 300 is made active and falls when the memory bank 300 is made inactive. The rasz signal is used to reset the word line (WL). When the rasz signal has the low level and the CKE signal supplied from the external unit falls to the low level, the timing control circuit 100 outputs a PD control signal so that the SDRAM is set in the PD mode. The PD control signal is used to cut off the DC currents which are to be supplied to the respective input circuits. On the other hand, when the rasz signal has a high level and the CKE signal falls to the low level, the timing control signal 100 outputs a CSUS control signal so that the SDRAM is set in the CSUS mode. The CSUS control signal is used to suspend the internal clock signal.

The SDRAM is permitted an auto-precharge command operation. In accordance with a state of a predetermined address bit at the time of input of an operation command regarding a CAS (Column Address Strobe), the auto-precharge command operation can be executed. After the operation regarding the CAS is completed, a precharge operation is automatically executed in an operation regarding a RAS (Row Address Strobe). In the precharge operation, the potential of the word line is made to fall so that cell transistors in the memory bank 300 are cut off. For example, when a read command (READA) with the auto-precharge command is activated, the precharge operation is executed with reading of data (DQ) after the read command is detected in synchronism with the clock signal, as shown in FIG. 4. During a period ($t_{RP}$) in which the precharge operation is executed, a new command can not be issued. In addition, for example, when a write command (WRITA) with the auto-precharge command is activated, the write operation for data and the precharge operation are executed after the write command is detected in synchronism with the clock signal, as shown in FIG. 5. The precharge operation starts after a write recovery time $t_{RWL}$ elapses from the end of the burst. During the period $t_{RP}$ in which the precharge operation is executed, the new command can not be issued. In the read operation and the write operation as shown in FIGS. 4 and 5, the CAS latency which represents delay of the operation is set at two clocks (CL=2), and the burst length corresponding to the data length is set at two clocks (BL=2).

To indicate a state where the precharge operation described above is executed, the rasz signal which has risen in synchronism with the CLK signal is made to fall. That is, the level of the rasz signal indicates whether the precharge operation is executed.

In the conventional SDRAM in which the PD mode and the CSUS mode are distinguished from each other using the rasz signal which indicates whether the auto-precharge operation is executed, the following inconvenience occurs.

As shown in FIG. 6, in a state where the memory bank 300 is in the active state so that the data (DQ) is output in synchronism with the internal clock signal CLK, the rasz signal has a high level. In this state, when the CKE falls to a low level, the SDRAM is set in the CSUS mode. In addition, when it is detected, in synchronism with the internal clock signal CLK, that the burst is completed (at a time (a)), the precharge operation starts and the rasz signal falls to the low level. The data then falls to the low level or rises to the high level. At this time, if the CKE has the high level, the SDRAM is set in the PD mode, so that the power to the input circuit for the external clock signal is turned off. As a result, immediately after the rasz signal falls, the internal clock signal is suspended so that an output transistor which should be operated with synchronism with the internal clock is maintained in a current state. At this time, if the output transistor has not yet been in a high-impedance state (a state where data is not output) after the data is completely output, the SDRAM in which the output transistor is in a conductive state (a state where the data is output) is maintained in the PD mode.

In the case shown in FIG. 6, the CAS latency is set at one clock (CL=1) and the burst length is set at four clocks (BL=4).

FIG. 7 shows a case where the CAS latency is set at two clocks (CL=2) and the burst length is set at four clocks (BL=4). FIG. 8 shows a case where the CAS latency is set at three clocks (CL=3) and the burst length is set at four clocks (BL=4). In the cases shown in FIGS. 7 and 8, after one clock from the end of the bust signal, the precharge operation starts. In these cases, after and before the rasz signal falls, the inconvenience, based on the clock at the time (a), occurs in the same manner as in the above case.

Thus, the conventional SDRAM has to be used with the limit in which the CKE is inhibited from falling before and after the rasz signal falls.

SUMMARY OF THE INVENTION

Accordingly, a general object of the present invention is to provide a novel and useful synchronous semiconductor device in which the disadvantages of the aforementioned prior art are eliminated.

A more specific object of the present invention is to provide a synchronous semiconductor device, such as the SDRAM, in which the limitation for entry of the PD command and the CSUS command is eliminated so that the manner of using the device can be improved.

The above objects of the present invention are achieved by a synchronous semiconductor device operating in synchronism with a clock signal supplied from an external unit, the synchronous semiconductor device capable of being set in a power down mode, the power down mode being a mode in which operations of predetermined circuits are inactivated, the synchronous semiconductor device comprising: first signal generating means for generating a first internal signal having a first state and a second state which permits the synchronous semiconductor device to be in a state where data is not output; second signal generating means for generating a second internal signal, a change of the second internal signal from a first state to a second state being delayed for a delay time from a change of the first internal signal from the first state to the second state; and timing control means for activating the power down mode in synchronism with the clock signal when the second internal signal is in the second state, so that the synchronous semiconductor device is in the power down mode.

According to the present invention, the second internal signal is changed from the first state to the second state after the delay time elapses from a time at which the first internal signal is changed from the first state to the second state. Thus, when the synchronous semiconductor device is permitted to be in the state where the data is not output, the power down mode is activated. That is, the power down mode is not activated when the synchronous semiconductor device is in a state where the data is output.

Thus, before and after the synchronous semiconductor device is changed from the state where the data is output to the state where the data is not output, the predetermined external signal can be controlled to be in the predetermined state without a particular limit. As a result, the synchronous semiconductor, such as the SDRAM, can be easily used.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

A description will be given of an embodiment of the present invention.

Figure 1:
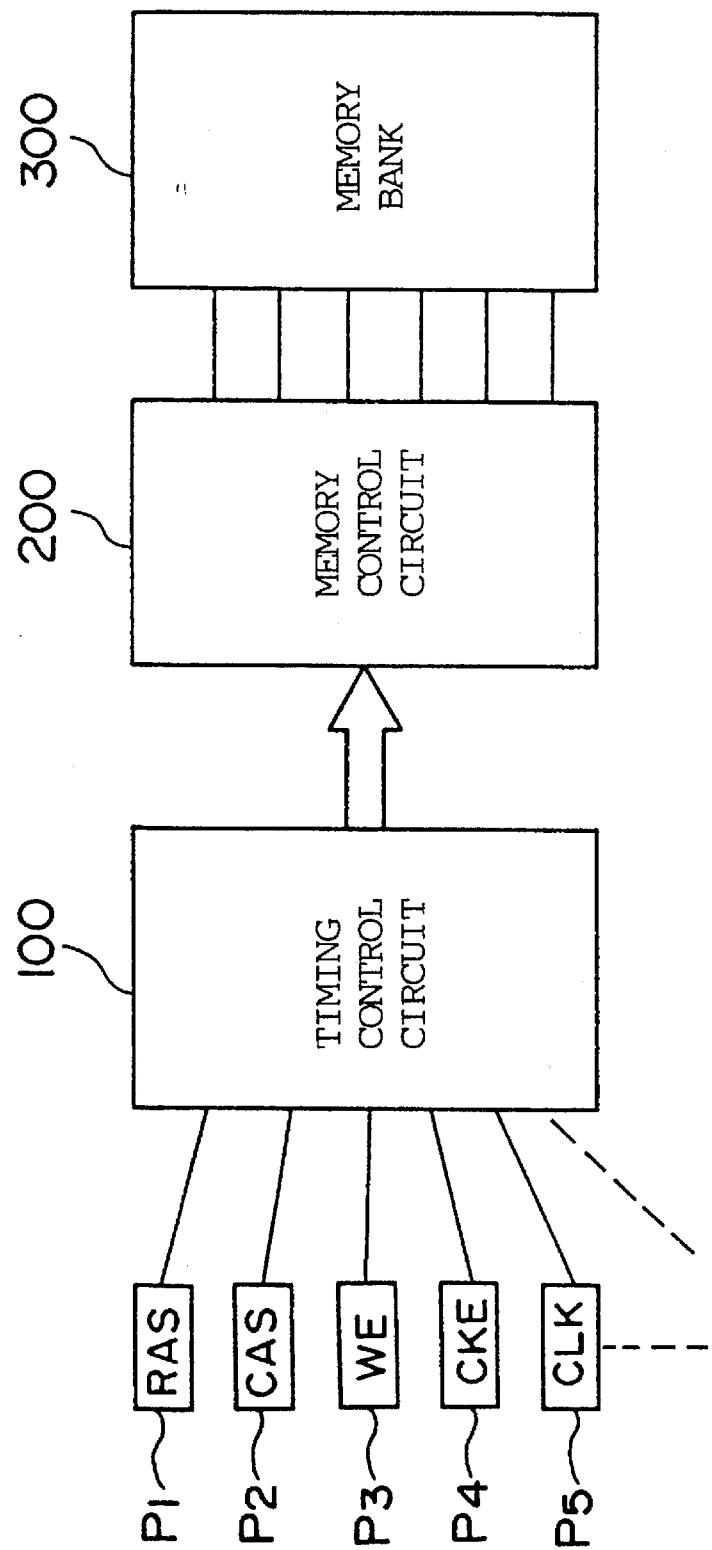
FIG. 1 is a block diagram illustrating a conventional synchronous DRAM.
Figure 2:
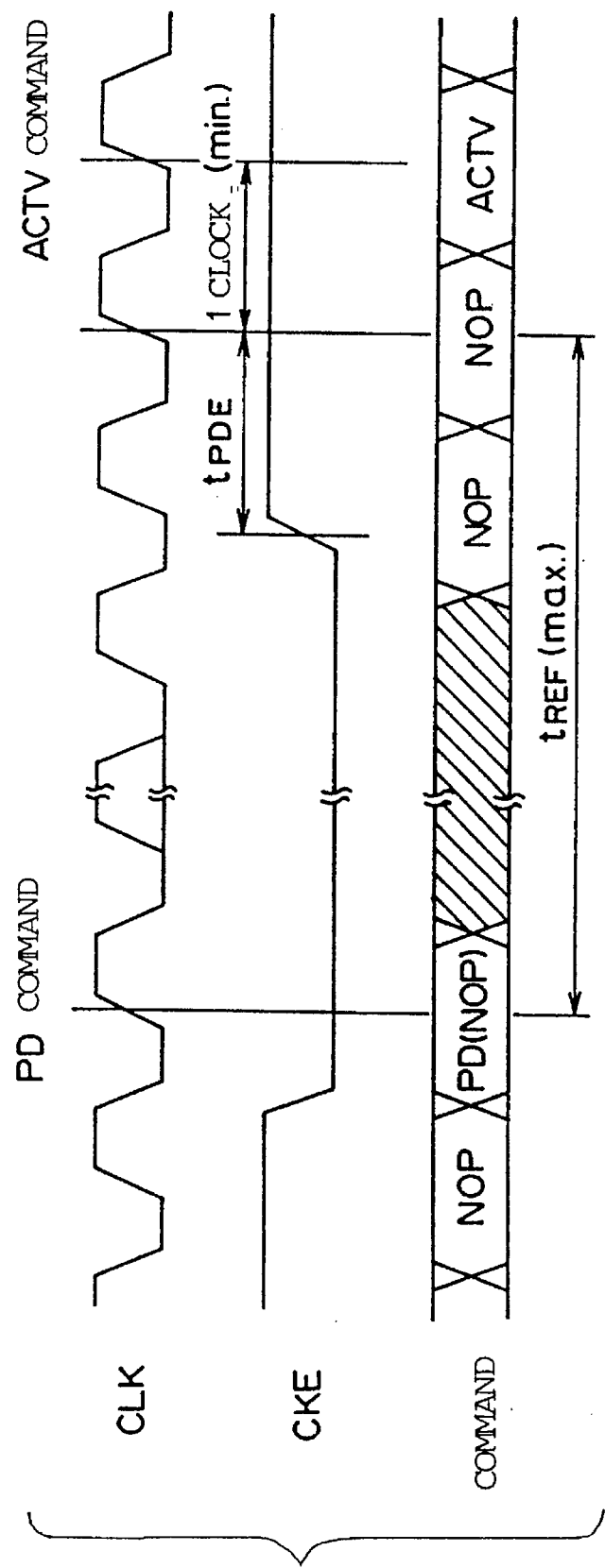
FIG. 2 is a timing chart illustrating an operation in a PD mode.
Figure 3:
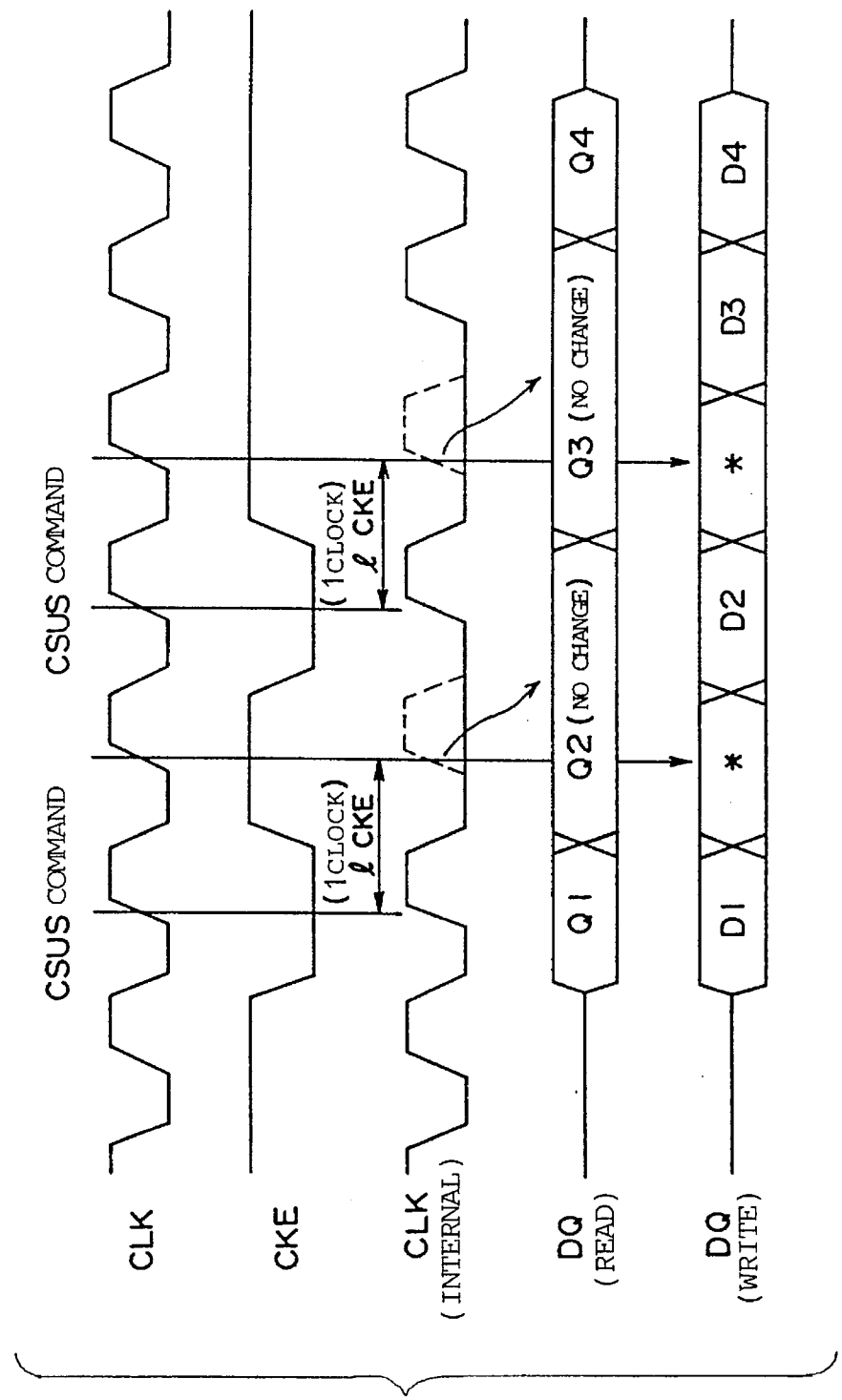
FIG. 3 is a timing chart illustrating an operation in a CSUS mode.
Figure 4:
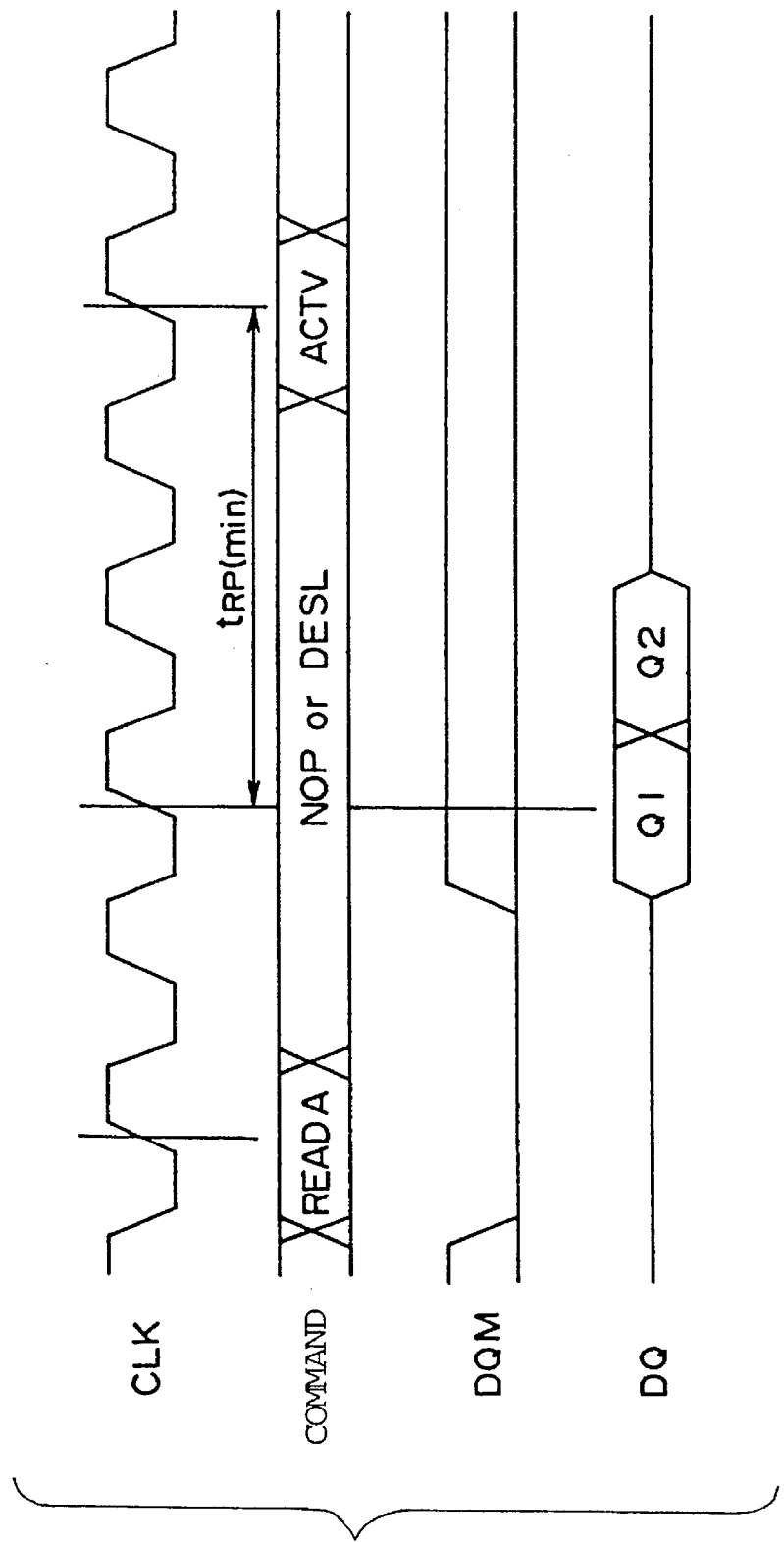
FIG. 4 is a timing chart illustrating an operation corresponding to a read command with an auto-precharge command.
Figure 5:
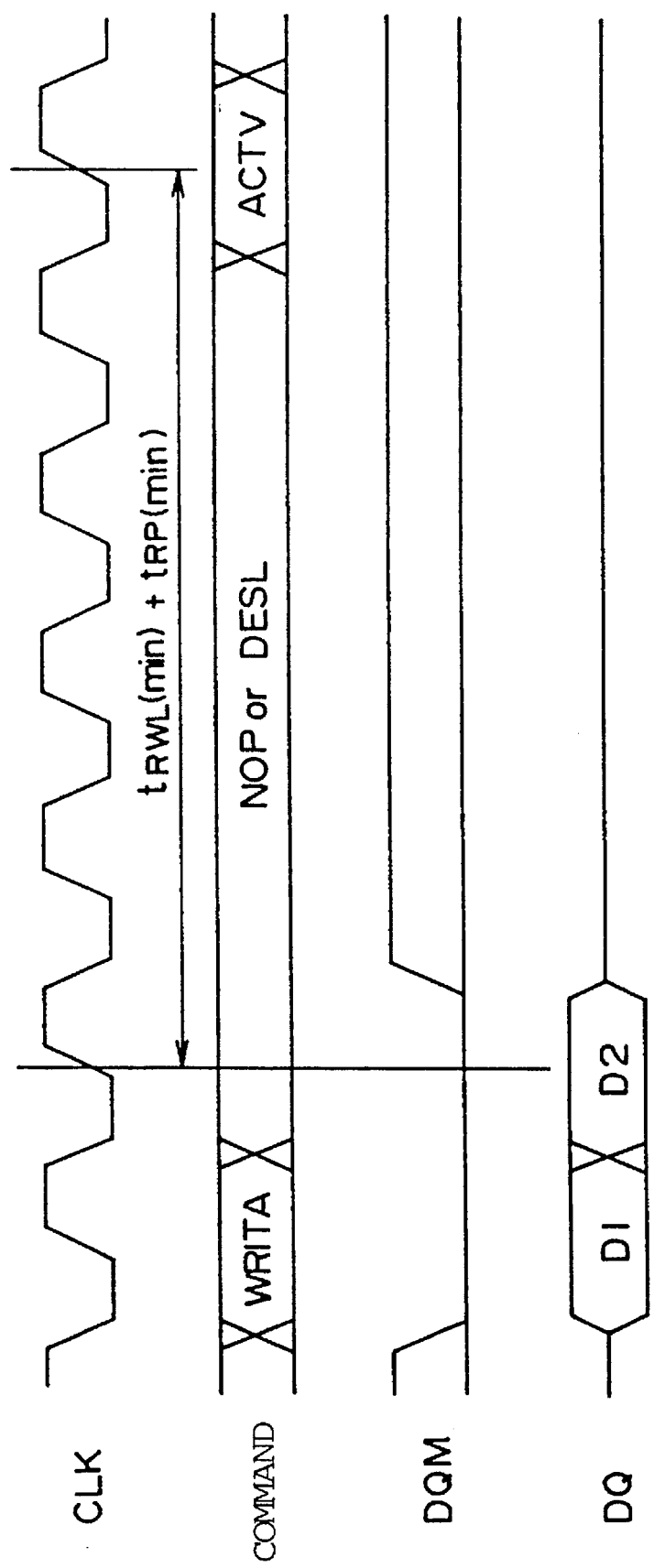
FIG. 5 is a timing chart illustrating an operation corresponding to a write command with the auto-precharge command.
Figure 6:
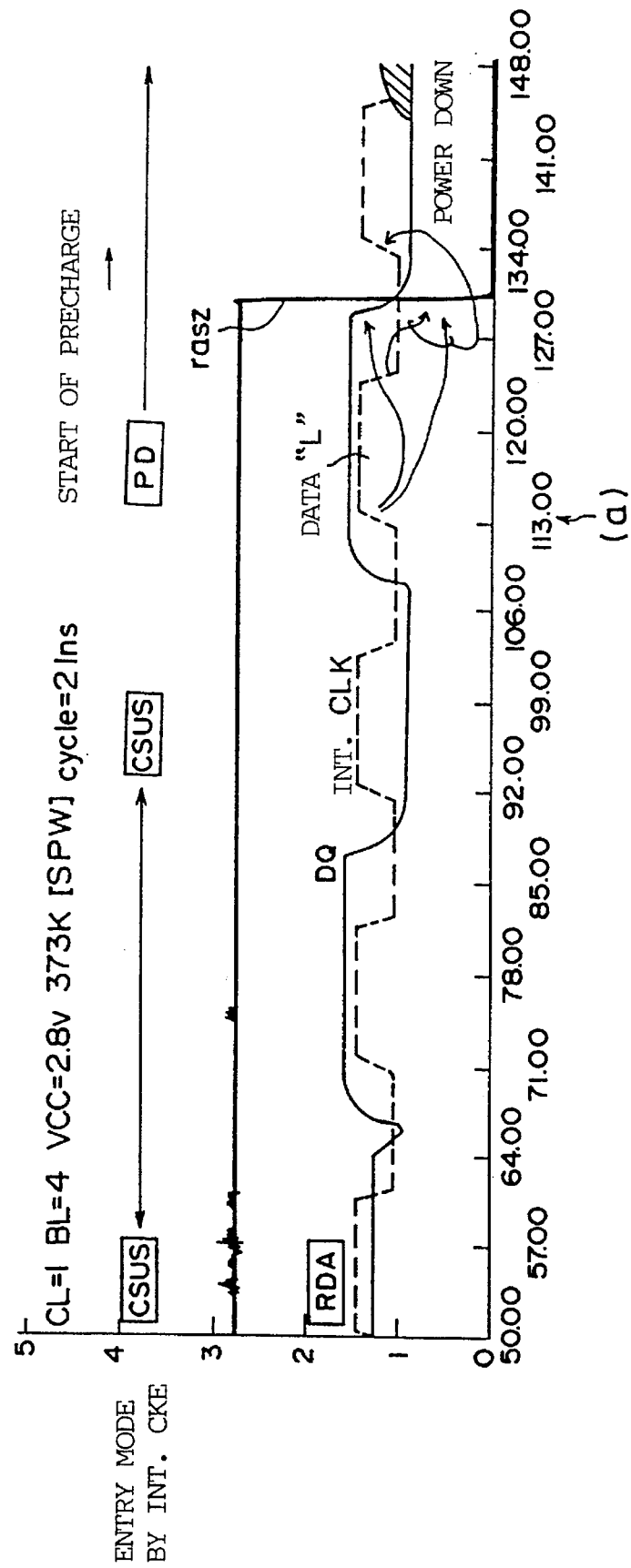
FIG. 6 is a waveform diagram illustrating states of signals before and after data is completely output in the SDRAM (the first case)
Figure 7:
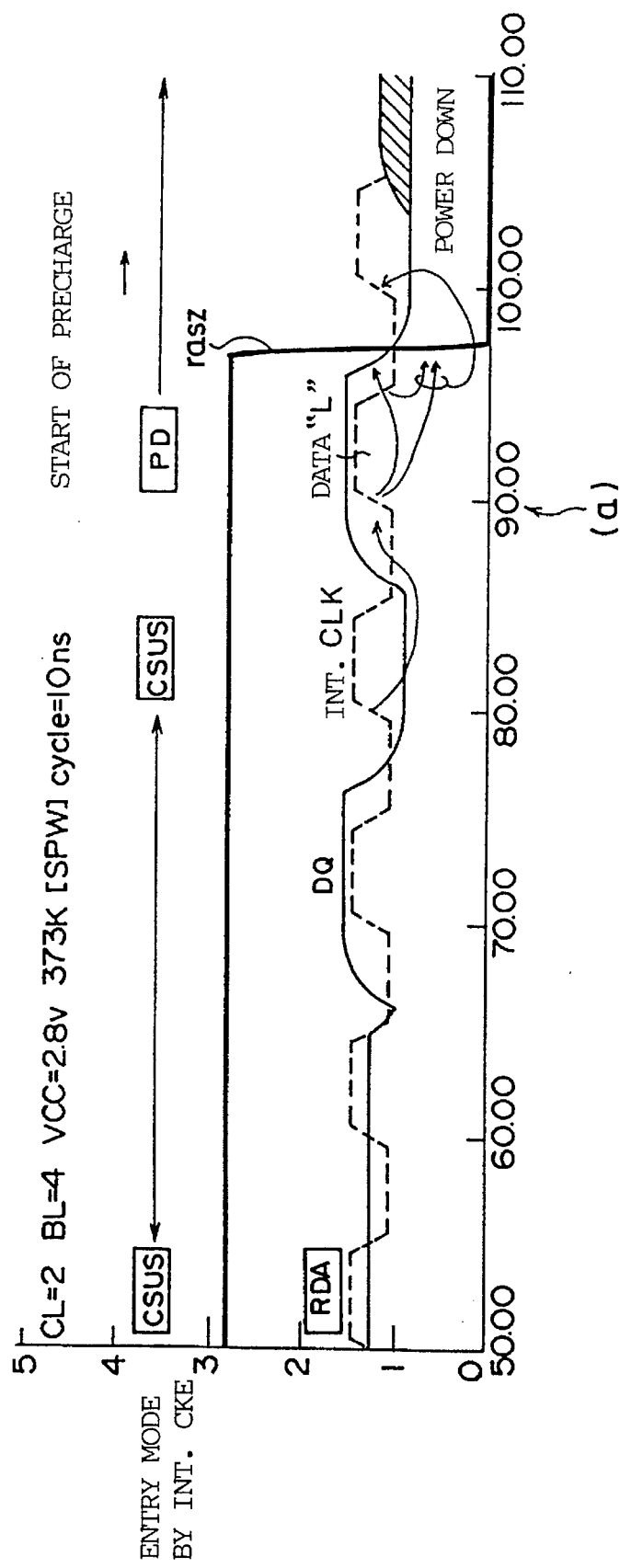
FIG. 7 is a waveform diagram illustrating states of signals before and after data is completely output in the SDRAM (the second case)
Figure 8:
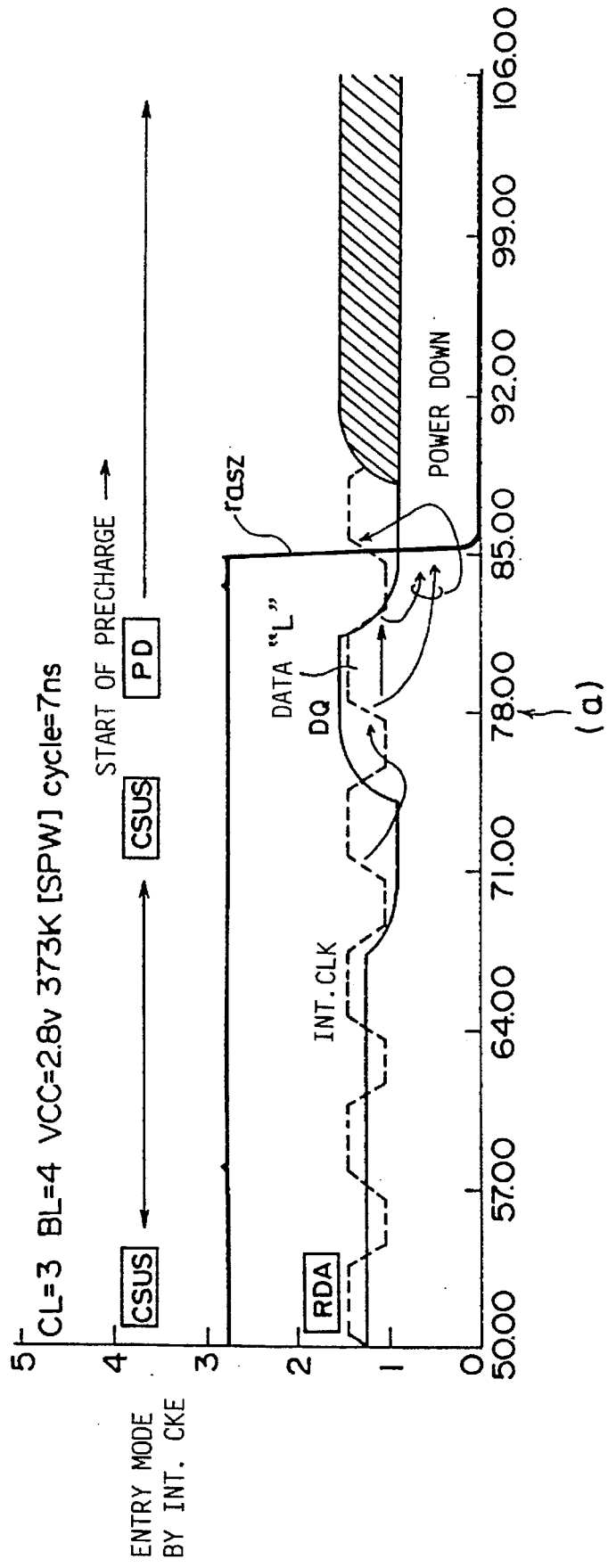
FIG. 8 is a waveform diagram illustrating sates of signals before and after data is completely output in the SDRAM (the third case)
Figure 9:
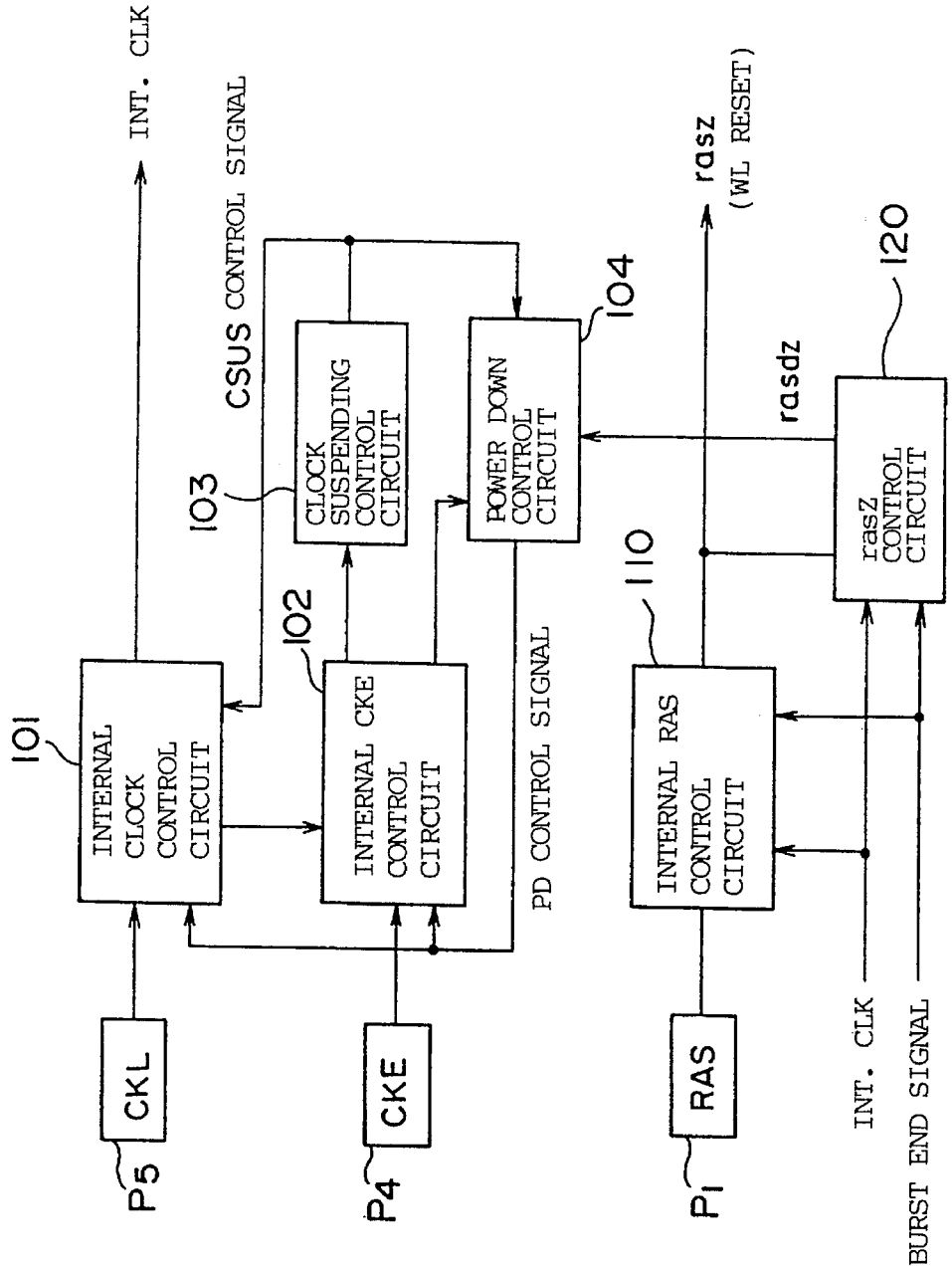
FIG. 9 is a block diagram illustrating a timing control circuit in a SDRM according to the present invention.

The structure of the SRAM according to an embodiment of the present invention is formed as shown in FIG. 1. In this embodiment, the timing control circuit 100 of the SRAM includes a circuit as shown in FIG. 9. Referring to FIG. 9, the circuit has an internal clock control circuit 101, an internal CKE control circuit 102, a clock suspending control circuit 103, a power down control circuit 104, an internal RAS control circuit 110 and a rasz control circuit 120.

The internal clock control circuit 101 controls an external clock signal supplied via the pad $P_5$ so as to generate an internal clock (an internal CLK) signal. The internal CKE control circuit 102 controls an external CKE signal supplied via the pad $P_4$ so as to generate an internal CKE signal. The clock suspending control circuit 103 generates, based on the internal CKE signal supplied from the internal CKE control circuit 102, a CSUS control signal which is used to set the SRAM in the CSUS mode. The CSUS control signal is supplied to the internal clock control circuit 101. The internal clock control circuit 101 outputs and stops outputting the internal clock signal in accordance with the state of the CSUS control signal. The power down control circuit 104 generates a PD control signal which is used to set the SDRAM in the PD mode, based on a rasdz signal from the rasdz control circuit 120, the CSUS control signal from the clock suspending control circuit 103 and the internal CKE signal from the internal CKE control circuit 102. The PD control signal output from the power down control circuit 104 is supplied to the internal clock control circuit 101 and the internal CKE control circuit 102. When the PD control circuit is active, DC current supply to input circuits provided in the internal clock control circuit 101 and the internal CKE control circuit 102 is cut off. As a result, functions of this timing control circuit 100 are discontinued (the power down).

The internal RAS control circuit 110 generates an internal RAS signal, that is, a rasz signal. The rasz signal rises in synchronism with an external RAS signal supplied from an external unit via the pad $P_1$. The rasz signal is trapped in the following stage by the external CLK signal. In the auto-precharge operation, the rasz signal falls at a time determined by the internal clock signal and the burst end signal which represents the end of data. The rasz signal is used to reset the word line (WL). When the memory bank 300 is in the active state, the rasz signal has the high level, and when the memory bank 300 in the inactive state, the rasz signal has the low level. The rasz control circuit 120 generates the rasdz signal based on the internal clock signal and the burst end signal. The rasdz signal rises in synchronism with rising of the rasz signal. The rasdz signal falls at a time obtained by delaying, based on the internal clock signal and the burst end signal, a time at which the rasz signal falls. As has been described above, the rasdz signal is supplied to the power down control circuit 104.

Figure 10:
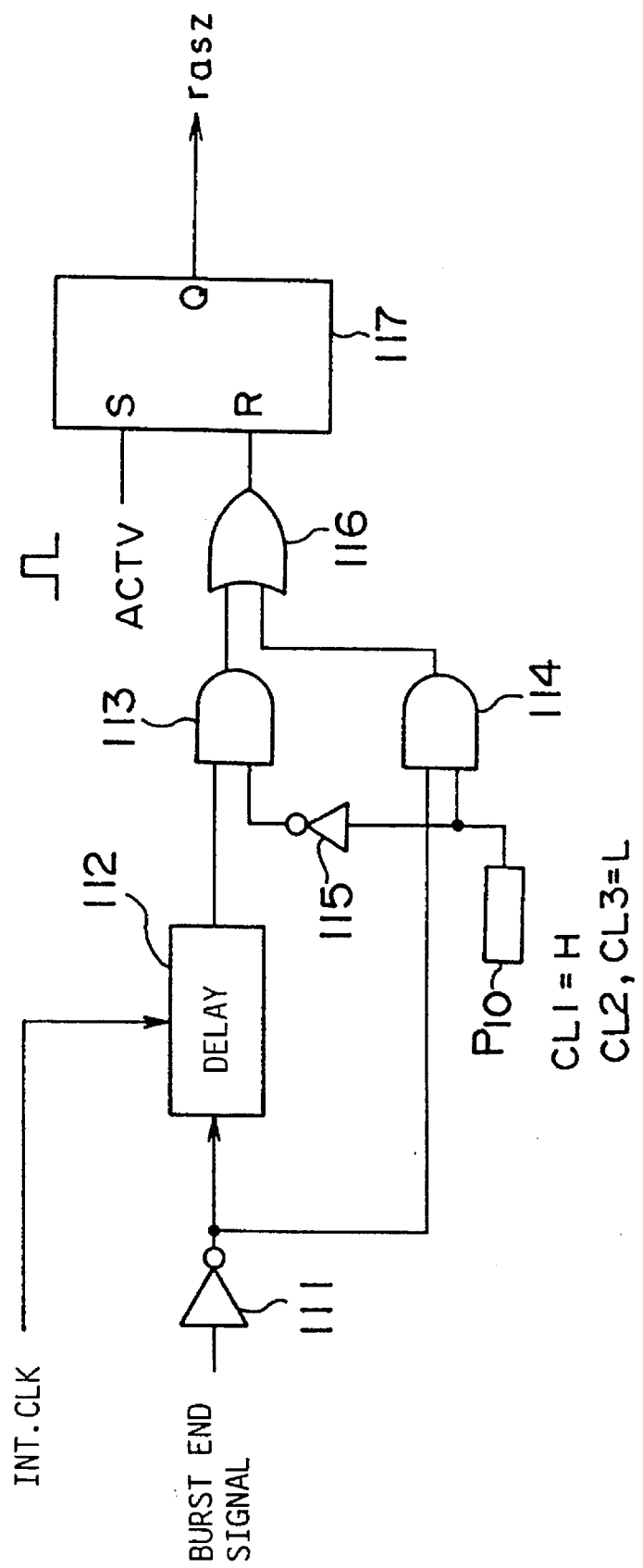
FIG. 10 is a block diagram illustrating an internal RAS control signal provided in the timing control circuit shown in FIG. 9.

The internal RAS control circuit 110 is formed as shown in FIG. 10. Referring to FIG. 10, the internal RAS control circuit 110 has a delay circuit 112 and a flip flop 117. The burst end signal is supplied to the delay circuit 112 via an inverter 111. An output signal of the delay circuit 112 is supplied to a reset terminal (R) of the flip flop 117 via an AND gate 113 and an OR gate 116. In addition, the burst end signal is also supplied to the reset terminal (R) of the flip flop 117 via the inverter 111, an AND gate 114 and the OR gate 116. The pad $P_{10}$ is provided with a control signal. In a case where the CAS latency is set at one clock (CL=1), the control signal supplied to the pad $P_{10}$ is maintained at a high level (H). In cases where the CAS latency is set at two and three clocks (CL=2 and 3), the control signal is maintained at a low level (L). The AND gate 114 is controlled by this control signal. This control signal is inverted by an inverter 115, and the output signal of the inverter 115 controls the AND gate 113. An ACTV signal corresponding to an active command for activating the memory bank 300 is supplied to a set terminal (S) of the flip flop 117.

Figure 11:
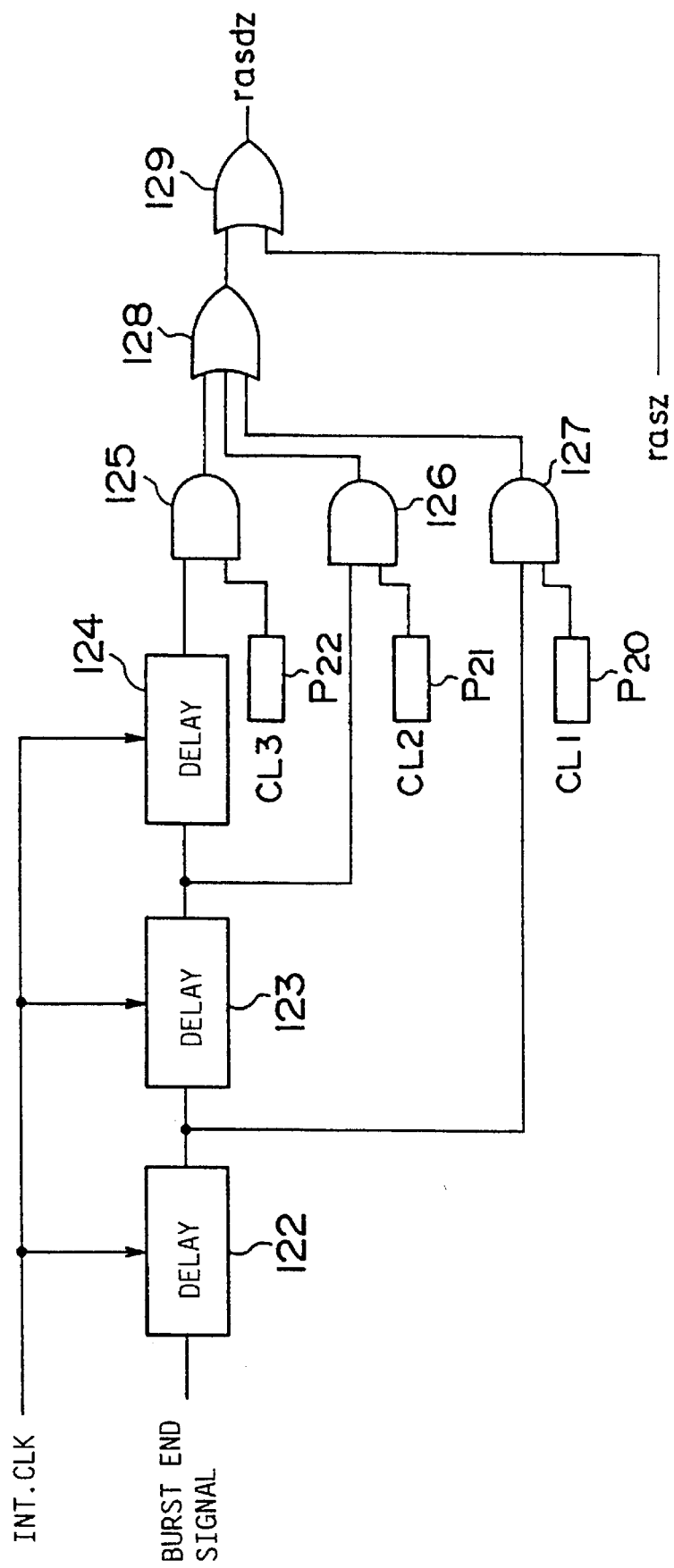
FIG. 11 is a block diagram illustrating a rasz control circuit provided in the timing control circuit shown in FIG. 9.

The rasz control circuit 120 is formed as shown in FIG. 11. Referring to FIG. 11, the rasz control circuit 120 has delay circuits 122, 123 and 124. Each of the delay circuits 122, 123 and 124 delays an input signal by one clock of the internal clock signal. The delay circuits 122, 123 and 124 are serially connected, and the delay circuit 122 located in the first stage is supplied with the burst end signal. The output signal of the delay circuit 124 located in the third (final) stage is supplied to an OR gate 128 via an AND gate 125. The output signal of the delay circuit 123 located in the second stage is supplied to the OR gate 128 via an AND gate 126. In addition, the output signal of the delay circuit 122 is supplied to the OR gate 128 via an AND gate 127. The AND gate 127 is controlled by a first control signal supplied to a pad $P_{20}$. In a case where the CAS latency is set at one clock (CL=1), the first control signal is maintained at the high level. The AND gate 126 is controlled by a second control signal supplied to a pad $P_{21}$. In a case where the CAS latency is set at two clocks (CL=2), the second control signal is maintained at the high level. The AND gate 125 is controlled by a third control signal supplied to a pad $P_{22}$. In a case where the CAS latency is set at three clocks (CL=3), the third control signal is maintained at the high level. The output signal of the OR gate 128 is input to the OR gate 129 to which the rasz signal is supplied from the internal RAS control circuit 110. The output signal of the OR gate 129 is output as the rasdz signal from the rasz control circuit 120.

Figure 12:
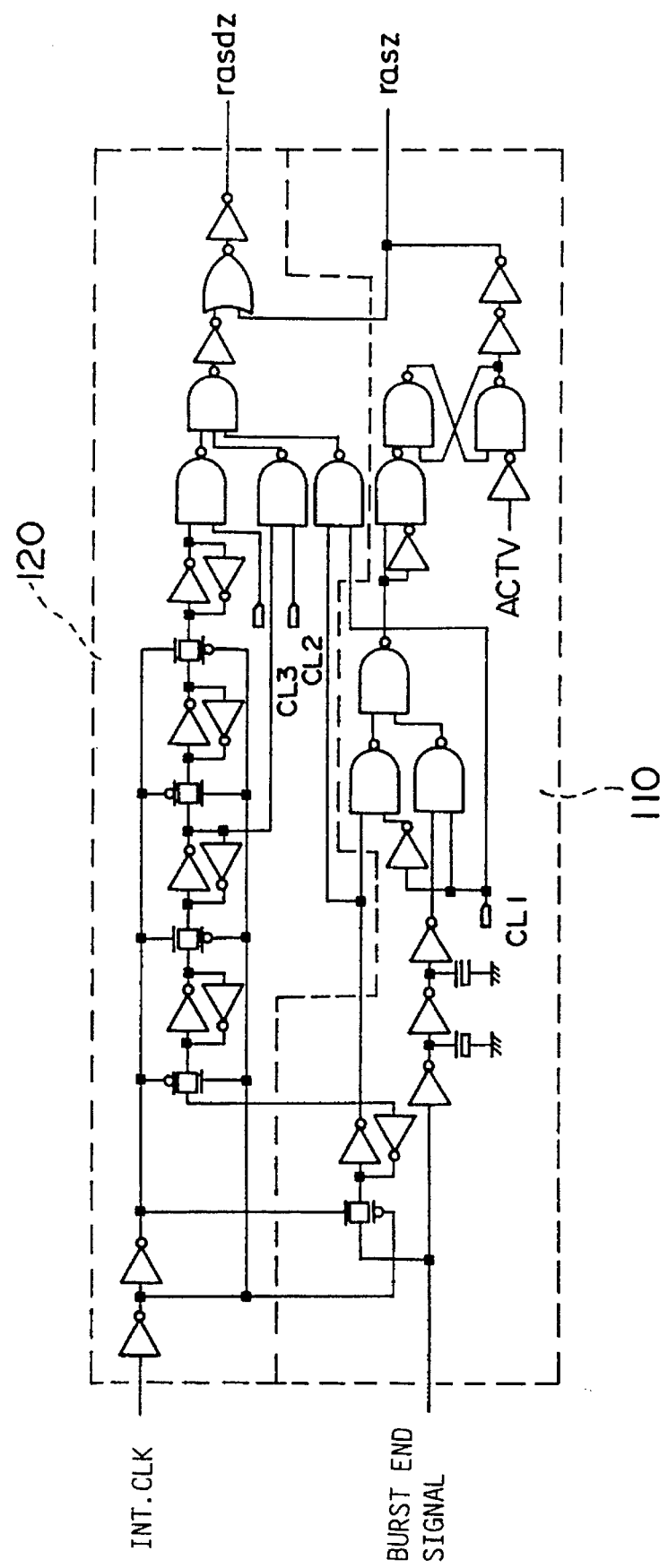
FIG. 12 is circuit diagram illustrating the internal RAS control circuit and the rasz control circuit.

The internal RAS control circuit 110 and the rasz control circuit 120 are further formed as a logic circuit as shown in FIG. 12. In this logic circuit shown in FIG. 12, one delay circuit is used as two delay circuits: the delay circuit 112 of the internal RAS control circuit 110 (see FIG. 10) and the delay circuit 122 of the rasz control circuit 120 (see FIG. 11).

Figure 13:
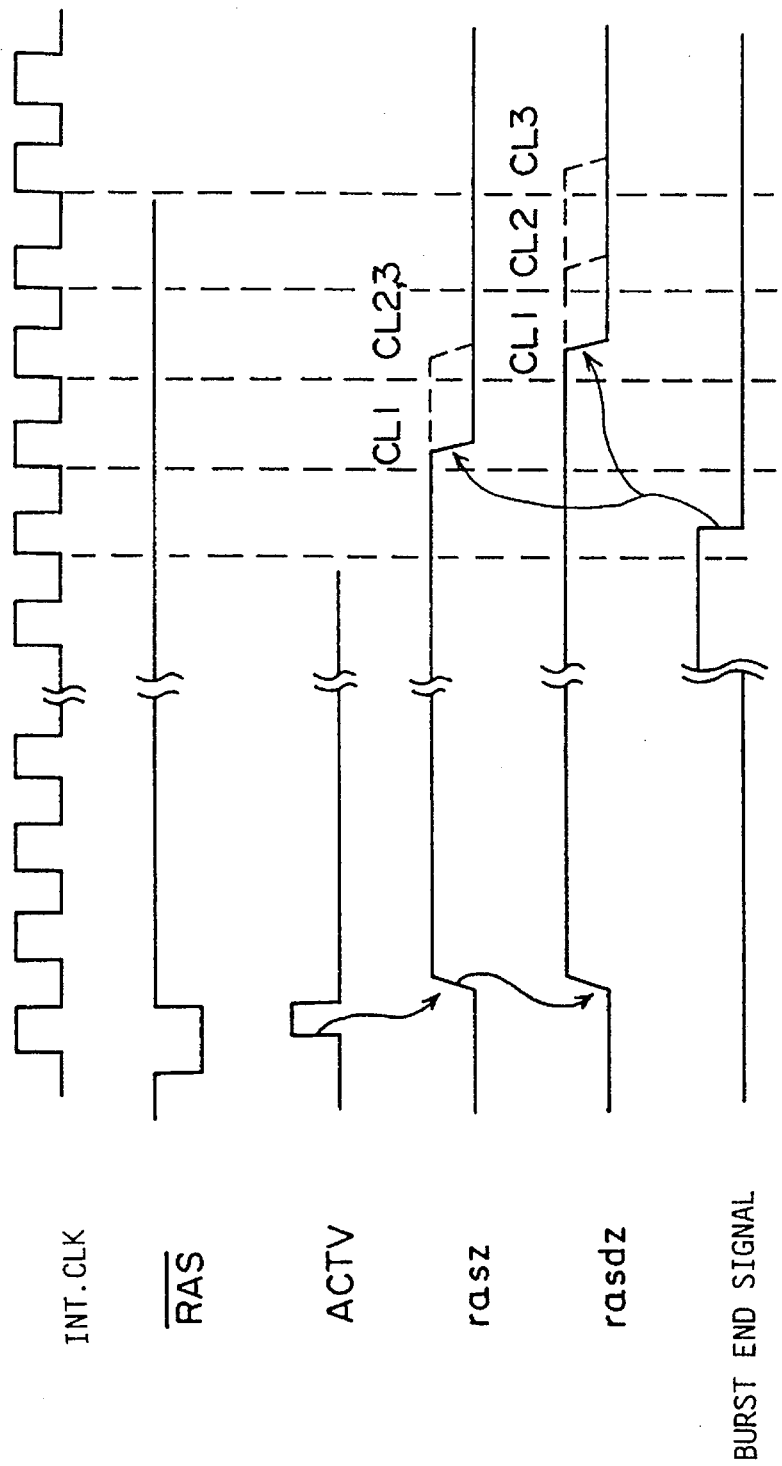
FIG. 13 is a timing chart illustrating a rasz signal and a rasdz signal which are generated by the internal RAS control circuit and the rasz control circuit.

In the internal RAS control circuit 110 and the rasz control circuit 120 formed as described above, the rising of the rasz signal is synchronized with the rising of the ACTV signal as shown in FIG. 13. Further, the rising of the rasdz signal is synchronized with the rising of the rasz signal. In the case where the CAS latency is set at one clock (CL=1), the falling of the rasz signal is synchronized with the falling of the burst end signal which represents the end of data. In this case, the falling of the rasdz signal is delayed by one clock from the falling of the burst end signal. In addition, in the cases where the CAS latency is set at two and three clocks (CL=2 and 3), the falling of the rasz signal is delayed by one clock from the falling of the burst end signal. In these cases (CL=2 and 3), the falling of the rasdz signal is delayed by one and two clocks from the falling of the burst end signal respectively.

The rasz signal which is controlled as described above is used to reset the word line in the same manner as in the conventional case. In a case of the auto-precharge operation, the falling of the rasz signal indicates a time at which the precharge operation starts. The rasdz signal in which the falling thereof is delayed with respect to the falling of the rasz signal is supplied to the power down control circuit 104. The power down control circuit 104 generates the PD control signal based on the rasdz signal. As a result, in a case where the internal CKE signal has the low level, the CSUS mode and the PD mode are distinguished from each other based on the rasdz signal.

Figure 14:
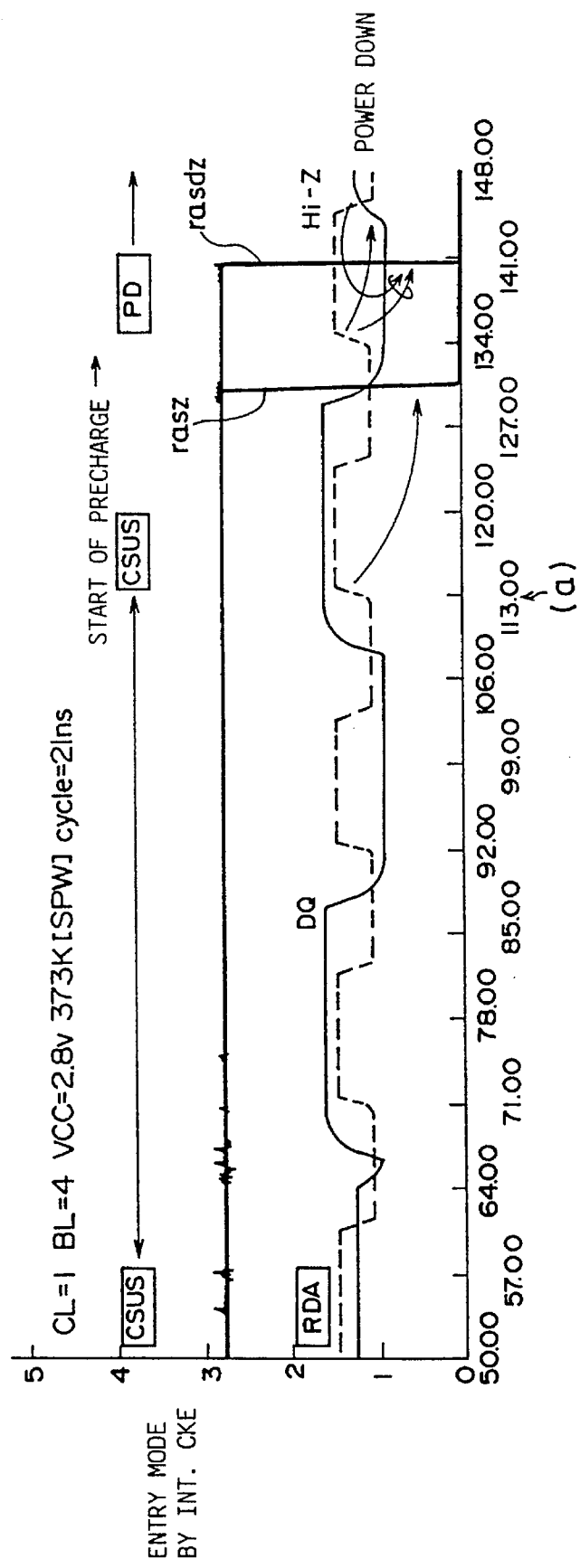
FIG. 14 is a waveform diagram illustrating states of signals before and after data is completely output in the timing control circuit shown in FIG. 9 (the first case)
Figure 15:
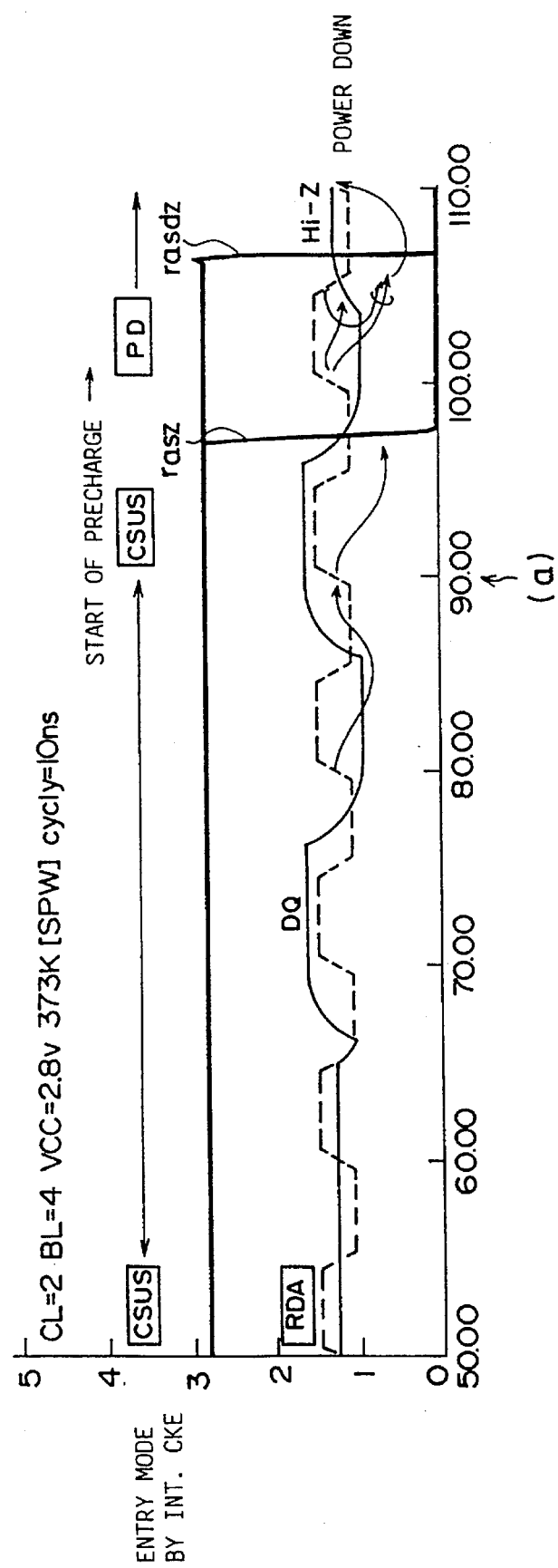
FIG. 15 is a waveform diagram illustrating states of signals before and after data is completely output in the timing control circuit shown in FIG. 9 (the second case)
Figure 16:
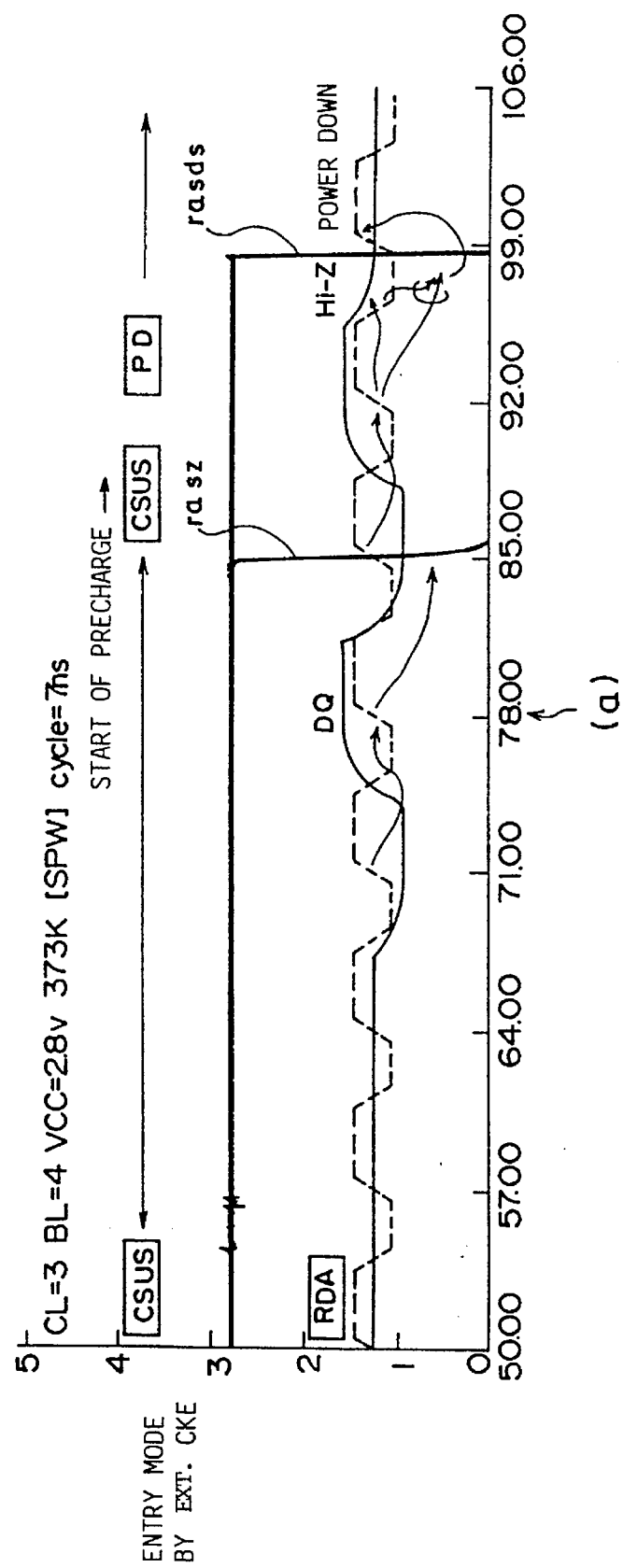
FIG. 16 is a waveform diagram illustrating states of signals before and after data is completely output in the timing control circuit shown in FIG. 9 (the third case).

In a case where data is completely output and the auto-precharge operation is performed under a condition in which the internal CKE signal has the low level, the levels of the rasz signal and the rasdz signal are changed as shown in FIGS. 14, 15 and 16. In a case shown in FIG. 14, the CAS latency is set at one clock (CL=1) and the burst length is set at four clocks (BL=4). In this case, when the burst end signal is detected in synchronism with the internal clock signal (at timing (a)), the precharge operation starts and the rasz signal falls to the low level. At this time, the data falls to the low level in this embodiment. In synchronism with the next clock, the operation mode is switched from the CSUS mode to the PD mode and the rasdz signal falls to the low level. Further the data becomes in a high-impedance state (Hi-z). After this, in response to the falling of the rasdz signal, the DC currents supplied to the input circuits of the internal clock control circuit 101 and the internal CKE control circuit 102 are cut off. Thus, the PD mode is maintained under a condition in which the data is in the high-impedance state.

In a case shown in FIG. 15, the CAS latency is set at two clocks (CL=2) and the burst length is set at four clocks (BL=4). In a case shown in FIG. 16, the CAS latency is set at three clocks (CL=3) and the burst length is set at four clocks (BL=4). In these cases, in the same manner as in the above case, causing detection of completion of outputting data (at the timing (a)), the rasz signal falls to the low level, and causing falling of the rasz signal, the precharge operation starts. Then, after the end of the burst data, the data becomes in the high impedance state (Hi-z). In response to the falling of the rasdz signal which is delayed by a predetermined number of clocks from the falling of the rasz signal, the operation mode is changed to the PD mode.

According to the above timing control, after the precharge operation starts and the data becomes in the high impedance state, the DC currents supplied to the input circuits are cut off (the power down) in the PD mode. Thus, the PD mode is prevented from being maintained in a state where the data is being output (the data has either the low level or the high level). As a result, the SDRAM can be used without the limitation in which the CKE signal is inhibited from falling before and after the rasz signal falls. Thus, the SDRAM can be easily used.

The present invention is not limited to the aforementioned embodiments, and other variation and modifications may be made without departing from the scope of the claimed invention.

What is claimed is:

1. A synchronous semiconductor device operating in synchronism with a clock signal supplied from an external unit, said synchronous semiconductor device capable of being set in a power down mode, the power down mode being a mode in which operations of predetermined circuits are inactivated, said synchronous semiconductor device comprising:

first signal generating means for receiving an input signal and for generating a first internal signal based on said input signal, said first internal signal having a first state which permits said synchronous semiconductor device to be in a state where data is output and a second state which permits said synchronous semiconductor device to be in a state where data is not output;

second signal generating means for receiving said input signal and for generating a second internal signal based on said input signal, a change of the second internal signal from a first state to a second state being delayed for a delay time from a change of the first internal signal from the first state to the second state; and power down control means, connected to said second signal generating means, for activating the power down mode in synchronism with the clock signal based on said second internal signal when the second internal signal is in the second state, so that said synchronous semiconductor device is in the power down mode.

2. The synchronous semiconductor device as claimed in claim 1, wherein said synchronous semiconductor device is a synchronous dynamic random access memory (SDRAM).

3. The synchronous semiconductor device as claimed in claim 2, wherein the first internal signal generated by said first signal generating means is used in a precharge operation, the first internal signal indicating one of an active and inactive states of the synchronous semiconductor device.

4. The synchronous semiconductor device as claimed in claim 2, wherein said second signal generating means includes means for setting the delay time at a value corresponding to a CAS latency.

5. A synchronous semiconductor device operating in synchronism with a clock signal supplied from an external unit, said synchronous semiconductor device capable of being set in a power down mode, the power down mode being a mode in which operations of predetermined circuits are inactivated, said synchronous semiconductor device comprising:

a first signal generating circuit which receives an input signal and which generates a first internal signal based on said input signal, said first internal signal having a first state which permits said synchronous semiconductor device to be in a state where data is output and a second state which permits said synchronous semiconductor device to be in a state where data is not output;

a second signal generating circuit which receives said input signal and which generates a second internal signal based on said input signal, a change of the second internal signal from a first state to a second state being delayed from a change of the first internal signal from the first state to the second state; and a control circuit, connected to said second signal generating circuit, which activates the power down mode in synchronism with the clock signal based on said second internal signal when the second internal signal is in the second state, so that said synchronous semiconductor device is in the power down mode.

\* \* \* \* \*